(12) United States Patent
Moon

(10) Patent No.: US 7,795,656 B2
(45) Date of Patent: Sep. 14, 2010

(54) IMAGE SENSOR DEVICE HAVING BLACK PIXEL REGION

(75) Inventor: Chang-rok Moon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 85 days.

(21) Appl. No.: 12/017,489

(22) Filed: Jan. 22, 2008

(65) Prior Publication Data
US 2008/0191209 A1 Aug. 14, 2008

(30) Foreign Application Priority Data
Feb. 13, 2007 (KR) .................. 10-2007-0015094

(51) Int. Cl.
*H01L 31/0232* (2006.01)
*G01J 3/461* (2006.01)
(52) U.S. Cl. .................. 257/294; 257/435; 257/436; 257/440; 257/E27.13
(58) Field of Classification Search ......... 257/290–295, 257/431–432, 436, 440, E27.13
See application file for complete search history.

(56) References Cited
U.S. PATENT DOCUMENTS
2006/0038209 A1* 2/2006 Hashimoto .................. 257/294

2007/0001252 A1* 1/2007 Noda et al. .................. 257/432
2007/0187794 A1* 8/2007 Fukuyoshi et al. .......... 257/440
2008/0265354 A1* 10/2008 Wen et al. .................... 257/432

FOREIGN PATENT DOCUMENTS
| JP | 10-112533 | 4/1998 |
| JP | 2006-080252 | 3/2006 |
| KR | 1999-0054304 | 7/1996 |

* cited by examiner

*Primary Examiner*—Anh D Mai
(74) *Attorney, Agent, or Firm*—Myers Bigel Sibley & Sajovec

(57) ABSTRACT

An image sensor device includes an optical black pixel region and an active pixel region. The image sensor device includes a light receiving unit including a plurality of light sensitive semiconductor devices that are configured to detect light incident thereon, a pixel metal wire layer including a transparent material on the light receiving unit and including a plurality of metal wires therein, and a filter unit on the pixel metal wire layer. The filter unit includes a plurality of filters that are configured to transmit light according to a wavelength thereof. The filters of the filter unit in the optical black pixel region of the image sensor device have a single color. The image sensor device further includes a light blocking layer in the optical black pixel region between the filter unit and the light receiving unit. The light blocking layer is configured to block light that passes through the filter unit.

12 Claims, 4 Drawing Sheets

IMAGE SENSOR DEVICE HAVING BLACK PIXEL REGION

CLAIM OF PRIORITY AND CROSS-REFERENCE TO RELATED PATENT APPLICATION

This application claims priority under 35 USC §119 to Korean Patent Application No. 10-2007-0015094, filed on Feb. 13, 2007, in the Korean Intellectual Property Office, the disclosure of which is incorporated herein in its entirety by reference.

BACKGROUND

1. Field of the Invention

The present invention relates to semiconductor devices and methods of fabricating semiconductor devices, and more particularly, to image sensor devices and methods of fabricating image sensor devices.

2. Description of the Related Art

An image sensor is an apparatus that acquires an image using a light sensitive semiconductor device. In particular, some semiconductor devices have certain properties that react to external energy, such as energy from photons. Light reflected/emitted by any object present in nature has a unique energy characterized by its wavelength. An image sensor receives light reflected/emitted by an object through a filter of a pixel unit, and transforms the light energy into an electrical signal using a photodiode (PD) or other light-sensitive semiconductor device disposed within the image sensor.

FIGS. 1A and 1B are respectively a cross-sectional view and a plan view illustrating a conventional image sensor device.

Referring to FIGS. 1A and 1B, the image sensor device includes a light receiving unit 10, a pixel metal wire layer 20, a filter unit 30, and a lens unit 40. The light receiving unit 10 includes a plurality of photodiodes or other light sensitive semiconductor devices that transform detected light energy into an electrical signal. The pixel metal wire layer 20 includes a transparent material, for example, silicon oxide (SiO$_2$), and includes multi-layered metal wires 22 between pixels.

The filter unit 30 includes color filters 32, that is, regularly arranged red, blue, and green color filters, which receive and transmit light of corresponding wavelengths. As depicted in FIGS. 1A and 1B, the filter unit 30 is divided into an active pixel region A that receives light and an optical black pixel region B. In the optical black pixel region B, light is substantially prevented from reaching the light receiving unit 10. Therefore, the signal output by the light receiving unit 10 in the optical black region B can provide a standard with respect to a "black" signal (i.e. the absence of light). Resin layers 34 and 36 for planarizing the image sensor device are generally formed above and below the color filters 32.

As illustrated in FIG. 1B, the filters of the optical black pixel region B are formed using color filters 32 having the same arrangement as those in the active pixel region A. Referring to FIG. 1A, a layer 24 for blocking light is formed in the pixel metal wire layer 20 in a lower part of the optical black pixel region B. That is, a top metal layer 24 is formed in an upper part of the pixel metal wire layer 20 to block/reflect light entering into the optical black pixel region B through the lens unit 40.

In a conventional image sensor device, due to the presence of the top metal layer 24 in the optical black pixel region B, the overall thickness of the image sensor device is increased by as much as the thickness of the top metal layer 24. In addition, due to the presence of the top metal layer 24, some electrical characteristics of the optical black pixel region B can differ from those of the active pixel region A. That is, in order to improve the dark and/or noise characteristics of the light receiving unit 10, an annealing process, such as a hydrogen passivation process, is generally performed after the pixel metal wire layer 20 is formed. However, it can be difficult to apply the hydrogen passivation process to the optical black pixel region B due to the presence of the top metal layer 24. As a result, the electrical characteristics of the light receiving unit 10 in the optical black pixel region B can differ from those of the light receiving unit 10 in the active pixel region A.

SUMMARY

Some embodiments of the invention provide image sensor devices that can be formed small in size, and in which metal wires of a pixel metal wire layer can be formed in a similar manner in an active pixel region and an optical black region. Accordingly, a light receiving unit in the optical black pixel region and a light receiving unit in the active pixel region can have similar electrical characteristics.

An image sensor device according to some embodiments of the invention includes an optical black pixel region and an active pixel region. The image sensor device includes a light receiving unit including a plurality of light sensitive semiconductor devices that are configured to detect light incident thereon, and a pixel metal wire layer including a transparent material on the light receiving unit and including a plurality of metal wires therein. The device further includes a filter unit on the pixel metal wire layer. The filter unit may include a plurality of filters that are configured to transmit light according to a wavelength thereof. The filters of the filter unit in the optical black pixel region of the image sensor device include filters of a single color. The image sensor device further includes a light blocking layer in the optical black pixel region between the filter unit and the light receiving unit. The light blocking layer is configured to block light that has passed through the filter unit.

The light blocking layer may include a film having a thickness and material composition sufficient to permit a hydrogen passivation process to be performed on the portion of the pixel metal wire layer under the light blocking layer. In some embodiments, the light blocking layer may include a low temperature deposited layer on the pixel metal wire layer in the optical black pixel region.

The light blocking layer may include a combination of organic films that may be configured to absorb and/or reflect light that has passed through the filter unit.

The filters in the optical black pixel region may include blue color filters, and the light blocking layer in the optical black pixel region may include amorphous silicon (a-Si) and/or crystalline silicon (Si) and may have an absorption and/or reflection property with respect to light that has passed through the filter unit.

The light blocking layer may include amorphous silicon having a thickness greater than a penetration depth of light having a wavelength of the blue color. In particular, the light blocking layer may include amorphous silicon having a thickness of from about 0.01 μm to about 0.5 μm.

The metal wires in the pixel metal wire layer may have a similar structure in the optical black pixel region as in the active pixel region.

The light blocking layer may include a non-metallic material.

The pixel metal wire layer may include metal wires having a periodically repeating pattern in a transparent material layer.

The color filters in the filter unit may be disposed between transparent upper and lower resin layers, and the active pixel region may include regularly arranged red, green, and blue color filters.

The image sensor device may further include a plurality of lenses configured to focus light into the filter unit.

Some embodiments of the invention provide methods of fabricating an image sensor device. The methods include forming a light receiving unit including a plurality of light sensitive semiconductor devices on a substrate, forming a pixel metal wire layer including metal wires in a transparent material on the light receiving unit, and forming a filter unit on the pixel metal wire layer. The filter unit includes a plurality of filters configured to transmit light according to light wavelength, and the filter unit further includes an optical black pixel region and an active pixel region. Filters in the optical black pixel region have a single color type. The methods further include forming a light blocking layer between the filter unit and the light receiving unit. The light blocking layer is configured to block light that has passed through the filter unit.

The methods may further include performing a hydrogen passivation process on a portion of the pixel metal wire layer under the light blocking layer.

Forming the light blocking layer may include forming the light blocking layer on the pixel metal wire layer in the optical black pixel region using a low temperature deposition process.

The filters in the optical black pixel region include blue color filters, and the light blocking layer may include amorphous silicon (a-Si) and/or crystalline silicon (Si) having an absorption or reflection property with respect to light that has passed through the filter unit.

The light blocking layer may be formed of amorphous silicon having a thickness of greater than a penetration depth of light having a wavelength of the blue color. In particular, the light blocking layer may be formed of amorphous silicon having a thickness of from about 0.01 μm to about 0.5 μm.

The metal wires in the pixel metal wire layer may have a similar structure in the optical black pixel region and the active pixel region. The pixel metal wire layer may include metal wires having a periodically repeating pattern in a transparent material layer.

Forming the filter unit may include forming a lower transparent resin layer, forming the plurality of filters on the lower transparent resin layer, forming an upper transparent resin layer on the filters, and forming lenses for focusing light on the upper transparent resin layer. Filters of the plurality of filters in the active pixel region may include regularly arranged red, green, and blue color filters.

Further embodiments of the invention provide an image sensor device including a pixel in an optical black pixel region. The pixel includes a light receiving unit including a light sensitive semiconductor device that is configured to detect light incident thereon, a first optical filter on the light receiving unit and configured to transmit light within a band of wavelengths and to block light of other wavelengths, and a second optical filter on the light receiving unit and configured to block light within the band of wavelengths.

The second optical filter may be between the first optical filter and the light receiving unit. The first optical filter may be configured to transmit blue light.

The second optical filter may include a layer of amorphous silicon (a-Si) and/or crystalline silicon (Si). In particular embodiments, the light blocking layer may include amorphous silicon having a thickness greater than a penetration depth of light having a wavelength within the band of wavelengths. For example, the light blocking layer may include amorphous silicon having a thickness of from about 0.01 μm to about 0.5 μm.

In some embodiments, the second optical filter may include a layer that may be configured to reflect light having a wavelength within the band of wavelengths.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF EMBODIMENTS OF THE INVENTION

Figure 1A:
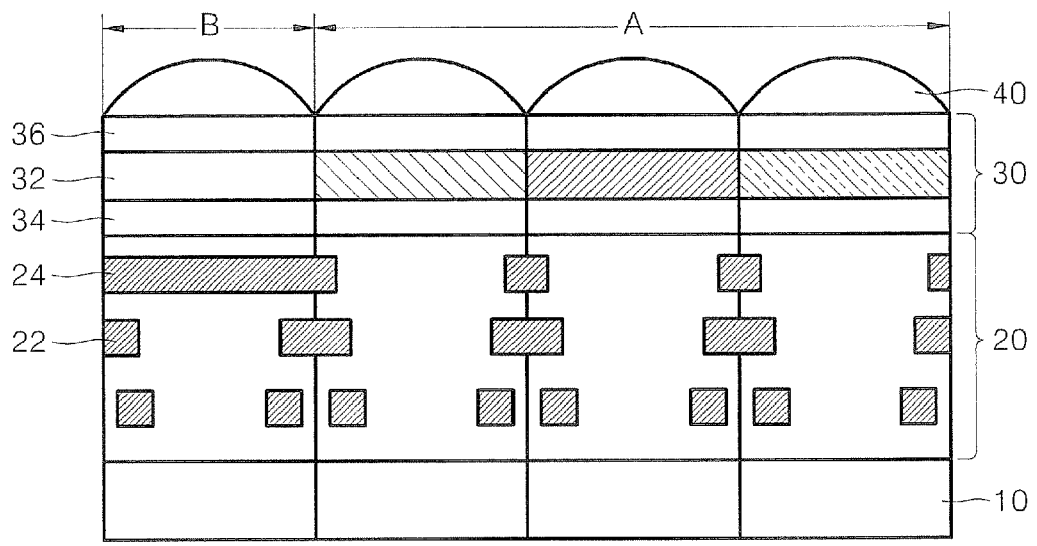
FIGS. 1A and 1B are respectively a cross-sectional view and a plan view illustrating a conventional image sensor device.
Figure 1B:
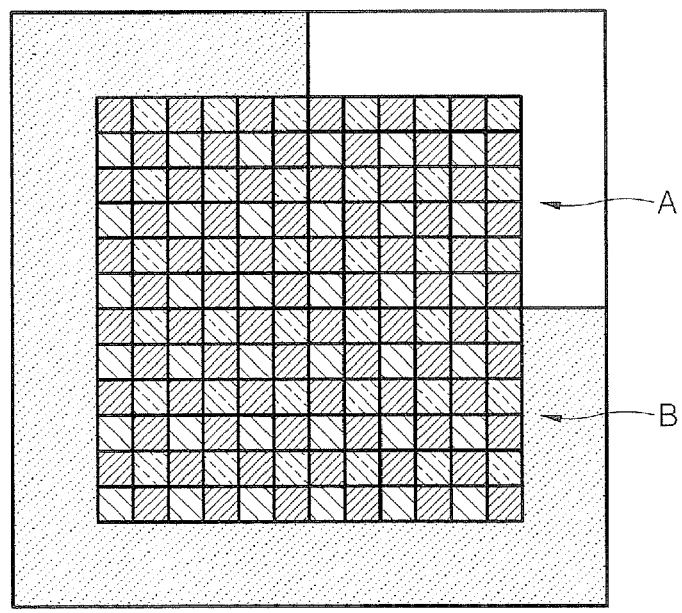

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

Figure 2A:
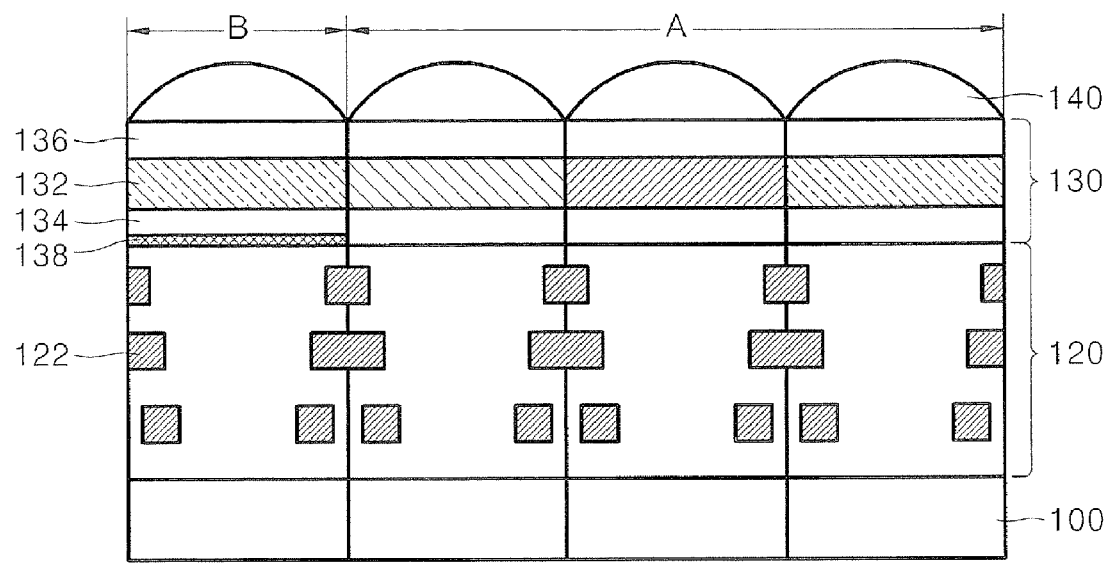
FIGS. 2A and 2B are respectively a cross-sectional view and a plan view illustrating an image sensor device according to embodiments of the present invention.

FIG. 2A is a cross-sectional view illustrating an image sensor device according to embodiments of the present invention.

Referring to FIG. 2A, the image sensor device includes a light receiving unit 100, a pixel metal wire layer 120, a filter unit 130, and a lens unit 140. The light receiving unit 100 includes a plurality of photodiodes or other optically sensitive semiconductor devices that transform detected light into an electrical signal. The pixel metal wire layer 120 includes a transparent material, such as silicon oxide ($SiO_2$), and includes multi-layered metal wires 122 between pixels.

The filter unit 130 includes color filters 132, which may include regularly arranged red, blue, and green color filters that receive and pass light of corresponding wavelengths, and is divided into an active pixel region A that detects incident light and an optical black pixel region B that provides a standard with respect to a "black" signal (i.e. the absence of light). Each of the color filters is configured to transmit light within a predetermined band of wavelengths, and to block light of other wavelengths. For example, a blue color filter is configured to transmit blue light and to block other colors of light, a red color filter is configured to transmit red light and to block other colors of light, etc.

In contrast to a conventional image sensor device, the filters 132 in the optical black pixel region B of a device according to some embodiments of the invention have a single color type (i.e., red, green, or blue). A light blocking layer 138 for blocking light that has passed through the filter 132 is formed below the filter 132 in the optical black pixel region B. The light blocking layer 138 can be formed of a material that absorbs and/or reflects light that is transmitted by the filters 132 in the optical black pixel region B, so that the light that has passed through the filter 132 cannot reach the light receiving unit 100 of the optical black pixel region B.

For example, a light blocking layer 138 having suitable light absorption characteristics can be formed of crystalline and/or amorphous silicon. The light absorbing characteristics of crystalline and amorphous silicon will be described in detail below with reference to FIG. 3. In some embodiments, a light blocking layer 138 having light reflection characteristics can be formed as a multilayer stack of organic films.

According to some embodiments of the invention, the light blocking layer 138 may not include a metal. As explained above, when a metal layer is used as the light blocking layer, the electrical characteristics of the active pixel region A and the optical black pixel region B may be different due to the difference in the wiring structures of the pixel metal wire layer in the active pixel region A and the optical black pixel region B and/or the difficulty of performing the hydrogen passivation process in the optical black region B due to the presence of the metal layer.

Transparent upper and lower resin layers 134 and 136 are respectively formed above and below the filters 132 to improve the planarity of the filter unit 130. A thin light blocking layer 138 including, for example, amorphous silicon, can be formed on an upper surface of the pixel metal wire layer 120, i.e., between the pixel metal wire layer 120 and the filter unit 130. The lens unit 140, which includes a plurality of lenses for focusing light onto the filters 132, is formed on the upper resin layer 136.

Figure 2B:
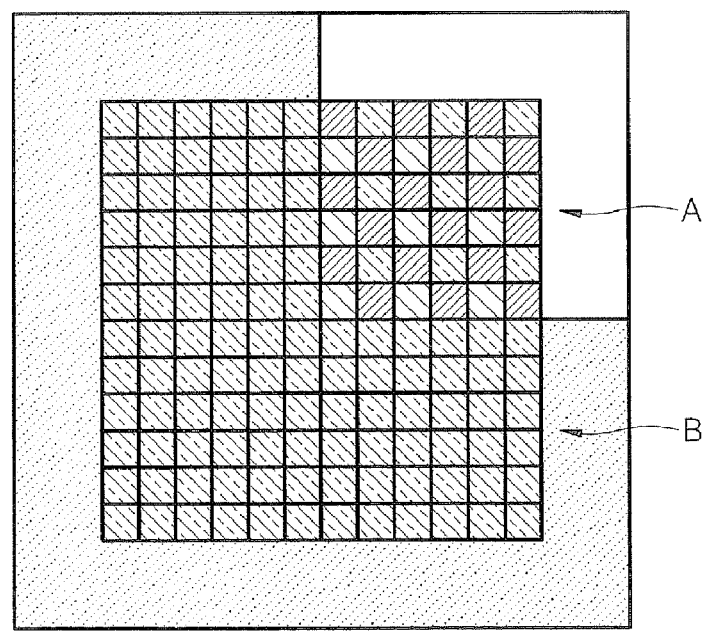

FIG. 2B is a plan view of the image sensor device of FIG. 2A. Referring to FIG. 2B, in an image sensor device according to some embodiments, the optical black pixel region B can include only one kind of filters, for example, blue filters. The light blocking layer 138, which absorbs light that has passed through the blue filters, is formed under the blue filters in the optical black pixel region B.

Because the light blocking layer 138 in some embodiments is formed of crystalline or amorphous silicon and not a metal, the metal wires 122 of the pixel metal wire layer 120 under the optical black pixel region B and the active pixel region A can be formed in the same structure. Also, by having the same structure of the metal wirings 122 in the pixel metal wire layer 120 in both the optical black pixel region B and the active pixel region A, the hydrogen passivation process in the optical black pixel region B can also be easily performed. Accordingly, the electrical characteristics in the light receiving unit 100 under the optical black pixel region B and the active pixel region A, such as a dark characteristic or a noise characteristic, can be about the same.

In addition, since the top metal layer can be omitted from an image sensor device according to some embodiments, the thickness of the image sensor device can be reduced as much as the thickness of the top metal layer. Accordingly, the problems of reducing sensitivity of the pixels and/or cross-talk between the pixels caused by the thickness of the pixel metal wire layer can be reduced to some extent.

Figure 3:
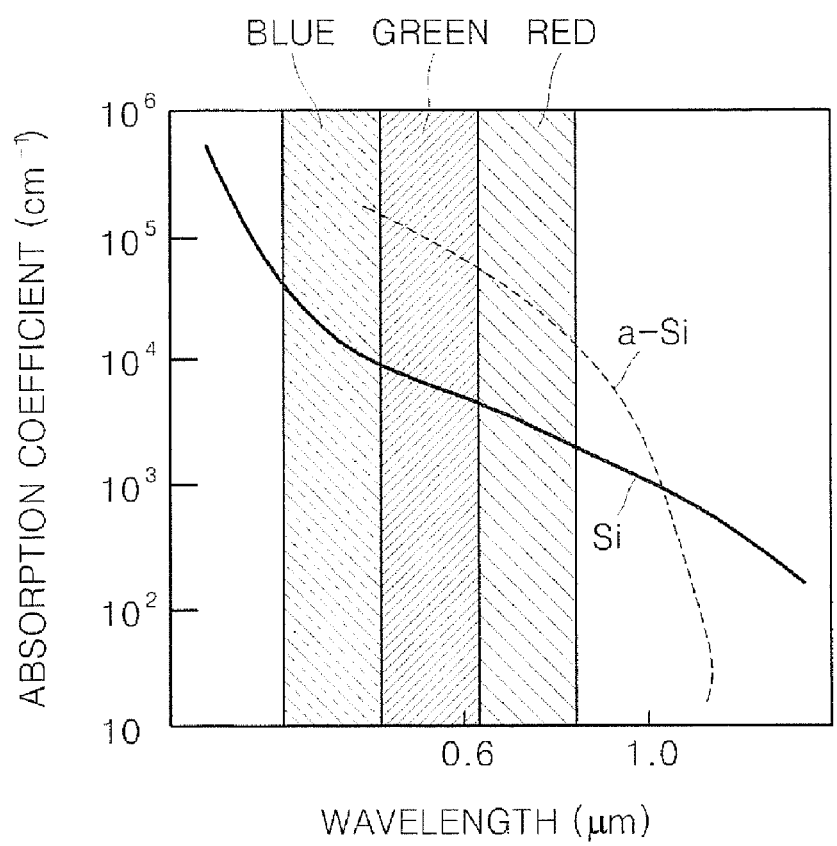
FIG. 3 is a graph showing light absorption of amorphous silicon and crystalline silicon according to wavelength of light.

FIG. 3 is a graph showing light absorption of crystalline and amorphous silicon according to the wavelength of light incident thereon.

As shown in FIG. 3, the absorption coefficients (per cm) of crystalline and amorphous silicon are higher at shorter wavelengths. Accordingly, a layer of crystalline and/or amorphous silicon can act as an optical filter that can effectively block light having a low wavelength, such as blue light, but may not be as effective in blocking light having longer wavelengths, such as red light.

Furthermore, as illustrated in FIG. 3, amorphous silicon may have a higher absorption coefficient than crystalline silicon at various wavelengths. In particular, in the blue wavelengths, amorphous silicon has an absorption coefficient that is about ten times (i.e., one order of magnitude) higher than that of crystalline silicon. From this result, it is seen that, when the filter in the optical black pixel region B of an image sensor device according to some embodiments includes blue filters (which transmit blue light and block light of other wavelengths) and the light blocking layer 138 is formed under the blue filters using amorphous silicon (which blocks blue light), light can be effectively blocked from entering the optical black pixel region B. Thus, an effective optical black pixel region B can be formed.

That is, when the filters in the optical black pixel region B are formed of blue color filters, light can be almost completely blocked from the optical black pixel region B by forming the light blocking layer 138 using amorphous silicon to a thickness, for example, 0.01 μm to 0.5 μm, which is greater than the penetration depth in amorphous silicon of light having a wavelength that is transmitted by the blue color filters. When the light blocking layer 138 is formed of amorphous silicon, a low temperature deposition process, for example, at a temperature of 500° C. or lower, can be used to form the light blocking layer 138. Therefore, a stable process can be performed on the pixel metal wire layer 120 that is compatible with a CMOS process.

In some embodiments, the optical black pixel region B can also include green and/or red color filters instead of and/or in addition to the blue color filters. That is, in some embodiments, the color filters in the optical black pixel region B can have different colors and/or colors other than blue. However, as it can be seen from the graph of FIG. 3, when the optical black pixel region B is formed of green or red color filters, the thickness of the light blocking layer 138 may be increased, due to the reduced absorption coefficients of crystalline and amorphous silicon in the green and red wavelength regions. The increased thickness of the light blocking layer 138 can adversely affect the sensitivity of the pixels, can increase optical cross-talk, and can increase the overall thickness of the image sensor device.

In some embodiments, the light blocking layer 138 can be formed of crystallized silicon. However, in order to obtain the same light blocking effect as amorphous silicon, a light blocking layer 138 formed of crystalline silicon must be formed approximately 10 times thicker than a light blocking layer 138 formed of amorphous silicon.

In an image sensor device according to some embodiments, the optical black pixel region B includes blue color filters and the light blocking layer 138 under the optical black pixel region B includes amorphous silicon, thereby potentially reducing the thickness of the image sensor device, increasing pixel sensitivity, and/or preventing cross-talk between the pixels. Also, when the light blocking layer 138 is formed of amorphous silicon, the light blocking layer 138 can be formed using a low temperature deposition, e.g., a process that can be performed at a temperature of 500° C. or lower. Thus, the fabrication process is compatible with general CMOS processes.

Furthermore, in an image sensor device according to some embodiments, it may not be necessary to form a conventional top metal layer on the pixel metal wire layer for blocking light. Therefore, the metal wires of the pixel metal wire layer 120 in the optical black pixel region B and the active pixel region A can be formed to have the same/similar structure. With the advantage of the uniformity of the metal wires of the pixel metal wire layer 120, a uniform hydrogen passivation process can be performed on the light receiving unit 100. Hence, some electrical characteristics, for example, a noise characteristic and/or a dark characteristic, of the light receiving unit 100 can be more uniform.

FIGS. 4A through 4D are cross-sectional views illustrating methods of fabricating image sensor devices according to some embodiments of the present invention.

Figure 4A:
FIGS. 4A through 4D are cross-sectional views illustrating methods of fabricating an image sensor device according to embodiments of the present invention.

Referring to FIG. 4A, a light receiving unit 100 having a plurality of light sensitive semiconductor devices that transform detected light into an electrical signal is formed on a substrate. The light sensitive semiconductor devices can include, for example, photodiodes including a dopant diffusion layer formed on the substrate. For example, when a P-type conductive substrate is used, the dopant diffusion layer can be formed in a P/N/P structure including a P0 region formed on a lower surface of the substrate, an N− region under the P0 region, and a highly concentrated P type (P+) region.

Figure 4B:
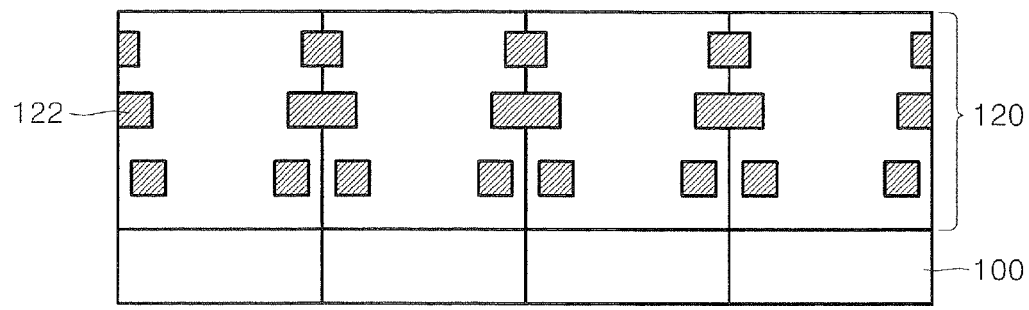

Referring to FIG. 4B, a pixel metal wire layer 120 including a transparent material, such as silicon oxide, is formed on the light receiving unit 100. A plurality of metal wires 122 are formed in the pixel metal wire layer 120. The metal wires 122 can include aluminum and/or copper, and can be more easily formed when compared to a conventional structure since the metal wires 122 can have the same structure in each of the pixels. That is, in a conventional structure, a layer for forming the top metal layer is added or a layout of the whole metal wires must be changed due to the formation of the top metal layer on the optical black pixel region B. As explained above, in some embodiments of the invention, the top metal layer can be omitted.

After the pixel metal wire layer 120 is formed, a hydrogen passivation process can be performed to improve electrical characteristics of the light receiving unit 100. The hydrogen passivation process can be performed via an annealing process under a hydrogen atmosphere. Thus, electrical characteristics of the light receiving unit 100 can be more uniform, since the metal wires 122 in each of the pixels are uniform. In a conventional structure, the electrical characteristics of the light receiving unit may not be uniform between the optical black pixel region B and the active pixel region A, since it may be difficult to perform the hydrogen passivation process in the optical black pixel region B due to the presence of the top metal layer.

Figure 4C:
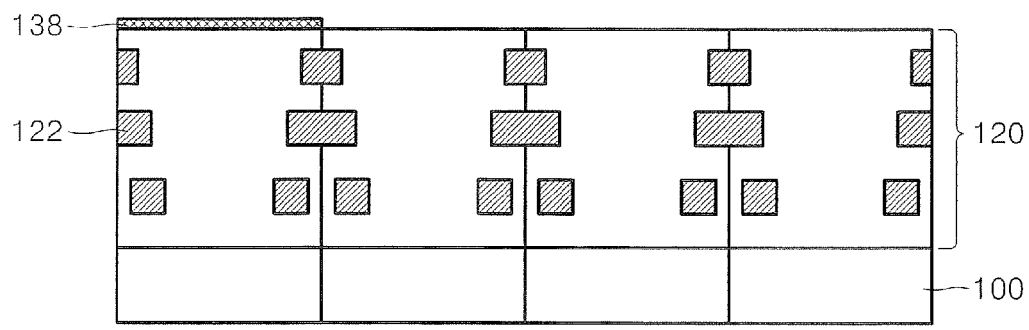

Referring to FIG. 4C, a light blocking layer 138 is formed on the pixel metal wire layer 120 in the optical black pixel region B. As described above, the light blocking layer 138 may be formed of amorphous silicon, which may have the advantages of reducing the overall thickness of the image sensor device and/or improving the stability of the metal wires 122 below the light blocking layer 138. Since the light blocking layer 138 can be relatively thin when the light blocking layer 138 is formed of amorphous silicon, the hydrogen passivation process can be performed after the formation of the light blocking layer 138.

Figure 4D:
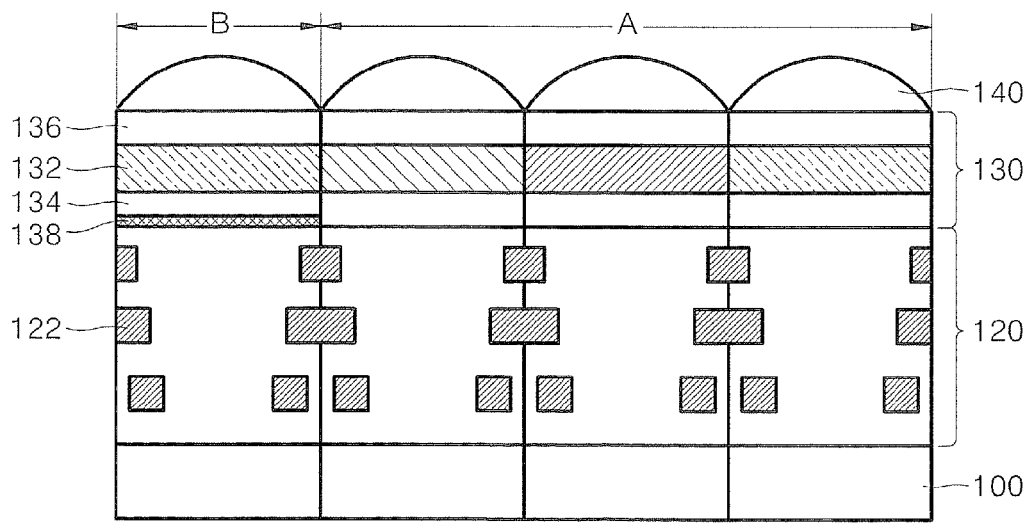

Referring to FIG. 4D, after a transparent lower resin layer 134 for planarizing the image sensor device is formed on the pixel metal wire layer 120 and on the light blocking layer 138, filters 132 are formed on the lower resin layer 134. Red, green, and blue color filters are regularly formed in the active pixel region A, and blue color filters are formed in the optical black pixel region B. As described above, forming the blue color filters in the optical black pixel region B can permit the thickness of amorphous silicon light blocking layers 138 under the blue color filters to be reduced.

A transparent upper resin layer 136 is formed on the filters 132 to planarize the surface of the image sensor device. A lens unit 140 can be formed on a filter unit 130, and thus, can include a plurality of lenses for focusing light to each of the filters 132 of the pixels.

As described above, an image sensor device according to embodiments of the present invention may have a reduced thickness and/or increased pixel sensitivity, and can have reduced cross-talk between pixels. According to some embodiments, a filter, such as a red, green, and/or blue color filter is used in an optical black pixel region. In particular, a blue color filter is formed in the optical black pixel region, and a light blocking layer below the blue filter is formed using amorphous silicon.

Also, when the light blocking layer is formed of amorphous silicon, the light blocking layer can be formed using a deposition process at a temperature of 500° C. or less. Thus, the fabrication process is compatible with CMOS processes, and can be used to stably form the light blocking layer.

Furthermore, since a conventional top metal layer for blocking light on the pixel metal wire layer can be omitted in some embodiments of the present invention, the metal wires of the pixel metal wire layer in the optical black pixel region and the active pixel region can be formed in the same structure, and thus, a hydrogen passivation process can be more uniformly performed on a light receiving unit in the optical black pixel region and the active pixel region. Accordingly, some electrical characteristics of the light receiving unit, such as a dark characteristic and a noise characteristic, can be uniformly improved.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. An image sensor device including an optical black pixel region and an active pixel region, the device comprising:
a light receiving unit including a plurality of light sensitive semiconductor devices that are configured to detect light incident thereon;
a pixel metal wire layer including a transparent material on the light receiving unit and including a plurality of metal wires therein;
a filter unit on the pixel metal wire layer, wherein the filter unit comprises a plurality of filters that are configured to transmit light according to a wavelength thereof, the filter unit including blue color filters in the optical black pixel region of the image sensor device; and
a light blocking layer in the optical black pixel region between the filter unit and the light receiving unit, wherein the light blocking layer is configured to block light that has passed through the filter unit;
wherein the light blocking layer in the optical black pixel region comprises silicon and has an absorption and/or reflection property with respect to light that has passed through the filter unit.

2. The image sensor device of claim 1, wherein the light blocking layer in the optical black pixel region comprises amorphous silicon (a-Si) and/or crystalline silicon (Si).

3. An image sensor device including an optical black pixel region and an active pixel region, the device comprising:
a light receiving unit including a plurality of light sensitive semiconductor devices that are configured to detect light incident thereon;
a pixel metal wire layer including a transparent material on the light receiving unit and including a plurality of metal wires therein;
a filter unit on the pixel metal wire layer, wherein the filter unit comprises a plurality of filters that are configured to transmit light according to a wavelength thereof, wherein the filters of the filter unit in the optical black pixel region of the image sensor device comprise filters of a single color; and
a light blocking layer in the optical black pixel region between the filter unit and the light receiving unit, wherein the light blocking layer is configured to block light that has passed through the filter unit;
wherein the filters in the optical black pixel region comprise blue color filters, and wherein the light blocking layer in the optical black pixel region comprises amorphous silicon (a-Si) and/or crystalline silicon (Si) and has an absorption and/or reflection property with respect to light that has passed through the filter unit.

4. The image sensor device of claim 3, wherein the light blocking layer comprises a film having a thickness and material composition that permits a hydrogen passivation process to be performed on the portion of the pixel metal wire layer under the light blocking layer.

5. The image sensor device of claim 3, wherein the light blocking layer comprises a combination of organic films that is configured to absorb and/or reflect light that has passed through the filter unit.

6. The image sensor device of claim 3, wherein the light blocking layer comprises amorphous silicon having a thickness greater than a penetration depth of blue light thereinto.

7. The image sensor device of claim 3, wherein the light blocking layer comprises amorphous silicon having a thickness of from about 0.01 µm to about 0.5 µm.

8. The image sensor device of claim 3, wherein the metal wires in the pixel metal wire layer have a similar structure in the optical black pixel region as in the active pixel region.

9. The image sensor device of claim 3, wherein the light blocking layer comprises a non-metallic material.

10. The image sensor device of claim 3, wherein the pixel metal wire layer comprises metal wires having a periodically repeating pattern in a transparent material layer.

11. The image sensor device of claim 3, wherein the filters in the filter unit are between transparent upper and lower resin layers, and the filters of the filter unit in the active pixel region include regularly arranged red, green, and blue color filters.

12. The image sensor device of claim 3, further comprising a plurality of lenses configured to focus light into the filter unit.

* * * * *